United States Patent [19]

Fan

[11] 4,248,687
[45] Feb. 3, 1981

[54] METHOD OF FORMING TRANSPARENT HEAT MIRRORS ON POLYMERIC SUBSTRATES

[75] Inventor: John C. C. Fan, Chestnut Hill, Mass.

[73] Assignee: Massachusetts Institute of Technology, Cambridge, Mass.

[21] Appl. No.: 59,794

[22] Filed: Jul. 23, 1979

Related U.S. Application Data

[63] Continuation-in-part of Ser. No. 946,264, Sep. 27, 1978, abandoned.

[51] Int. Cl.³ ............................................. C23C 15/00
[52] U.S. Cl. ................................. 204/192 P; 427/109; 427/160; 427/164; 427/166; 428/411; 428/480; 428/539
[58] Field of Search ..................... 204/192 P; 427/109, 427/160, 164, 166; 428/411, 480, 539

[56] References Cited

U.S. PATENT DOCUMENTS

| | | | |
|---|---|---|---|
| 2,932,590 | 4/1960 | Barrett | 428/432 |
| 3,907,660 | 9/1975 | Gillery | 204/298 |
| 4,065,600 | 12/1977 | King et al. | 428/432 |
| 4,142,958 | 3/1979 | Wei et al. | 204/192 P |

FOREIGN PATENT DOCUMENTS 51-35431 10/1976 Japan ...................................... 427/109

OTHER PUBLICATIONS

H. Hoffman et al., "HF-Sputtered Indium Oxide Films Doped with Tin," *Appl. Phys.*, vol. 16, pp. 239-246 (Jul. 1978).

K. Itogama, "Properties of Sn-Doped Indium Oxide Coatings Deposited on Polyester Film by High Rate Reactive Sputtering," *J. Electrochem. Soc.*, vol. 126, No. 4, Apr. 1979, pp. 691-694.

*Primary Examiner*—Aaron Weisstuch
*Attorney, Agent, or Firm*—Arthur A. Smith, Jr.; David E. Brook

[57] ABSTRACT

Transparent heat-mirrors are disclosed which are formed from tin-doped indium oxide films or antimony-doped tin oxide films deposited onto polymeric substrates. Low temperature deposition processes, such as ion-beam sputtering, are employed to preserve the polymeric substrates, and films having high transparency to visible radiation and high reflectivity to infrared radiation are deposited on the polymeric substrates by carefully controlling the partial pressure of oxygen during deposition.

10 Claims, 4 Drawing Figures

METHOD OF FORMING TRANSPARENT HEAT MIRRORS ON POLYMERIC SUBSTRATES

GOVERNMENT SUPPORT

This invention was partially supported by Grant No. 19628-76-C-0002 from the United States Air Force.

RELATED APPLICATION

This application is a continuation-in-part application of Ser. No. 946,264 filed Sept. 27, 1978, now abandoned.

BACKGROUND OF THE INVENTION

1. Field of the Invention

This invention is in the field of transparent heat mirrors for transmitting visible radiation and reflecting infrared radiation, and more particularly relates to transparent heat mirrors on polymeric substrates, such as flexible polymeric films.

2. Description of the Prior Art

Transparent heat mirrors are one class of spectrally selective coatings. They have optical properties which enable them to have high transmission of visible radiation and high reflectivity of infrared radiation. Such transparent heat mirrors have important applications as transparent thermal radiation shields with potential applications in solar energy collection, window insulation, etc.

One class of materials proposed for the formation of transparent heat mirrors is tin-doped indium oxide films. See, for example, Fan, J. C. C. and Bachner, F. J., *Applied Optics*, Vol. 15, No. 4, April 1976, pp 1012–1017; Fan, J. C. C., Bachner, F. J. and Foley, G. H., *Applied Physics Letters*, Vol. 31, No. 11, December 1977, pp 773–775; and Fan, J. C. C. and Bachner, F. J., *J. Electrochem. Soc.: Solid-State Science and Technology*, Vol. 122, No. 12, December 1975, pp 17-9-1725.

As evidenced by the afore-mentioned publications, tin-doped indium oxide films having sufficient optical properties to make them useful as transparent heat mirrors have been formed. Typically, however, such films have required either substrate temperatures during the deposition process exceeding the temperature resistance properties of most polymer film or a post-treatment, such as annealing, also requiring temperatures beyond those which most polymer films can tolerate. Almost all previous work in regard to these films involved radio frequency diode sputtering, which has too much intrinsic heating and electron bombardment for most available polymeric substrates. These obstacles to obtaining tin-doped indium oxide film of good wave-length selective properties on polymeric film have been recognized in the art. See, for example, Fan, J. C. C., Solid-State Chemistry of Energy Conversion and Storage, Advances in Chemistry Series 163, American Chemical Society, 1977, pp 149–164; and Sobajima et al., Proc. 6th International Vacuum Congress, 1974, Japan J. Appl. Phys. Suppl. 2, Pt. 1, 1974, pp 475–478.

SUMMARY OF THE INVENTION

This invention relates generally to the formation of tin-doped indium oxide films and antimony-doped tin oxide films which have high transparency to visible radiation and high reflectivity to infrared radiation on polymeric substrates, such as flexible polymeric films.

Such films can be successfully formed on polymeric films by employing a low temperature deposition process and by carefully controlling the partial pressure of oxygen during deposition.

In one embodiment, for example, an ion beam sputtering process is employed to deposit a tin-doped indium oxide film because the deposition does not heat the substrate to temperatures beyond that tolerable by many polymeric films. A target source containing a mixture of indium oxide and tin or tin oxide is bombarded with argon ions to cause ejection of atoms from the target source. During this deposition process, sufficient oxygen is admitted to the sputtering chamber to maintain the partial pressure within the chamber at a level between about $2 \times 10^{-5}$ Torr and about $5 \times 10^{-5}$ Torr.

This invention allows high quality transparent, heat-reflecting films to be deposited at low temperatures without any requirement for a post-deposition treatment to improve the quality of the films. Thus, transparent heat mirrors can be formed from tin-doped indium oxide and antimony-doped tin oxide films on polymeric substrates. This dramatically increases the useful applications for transparent heat mirrors formed from these materials.

DESCRIPTION OF PREFERRED EMBODIMENTS

A preferred embodiment of this invention can be illustrated in specific detail by reference to the Figures.

Figure 1:
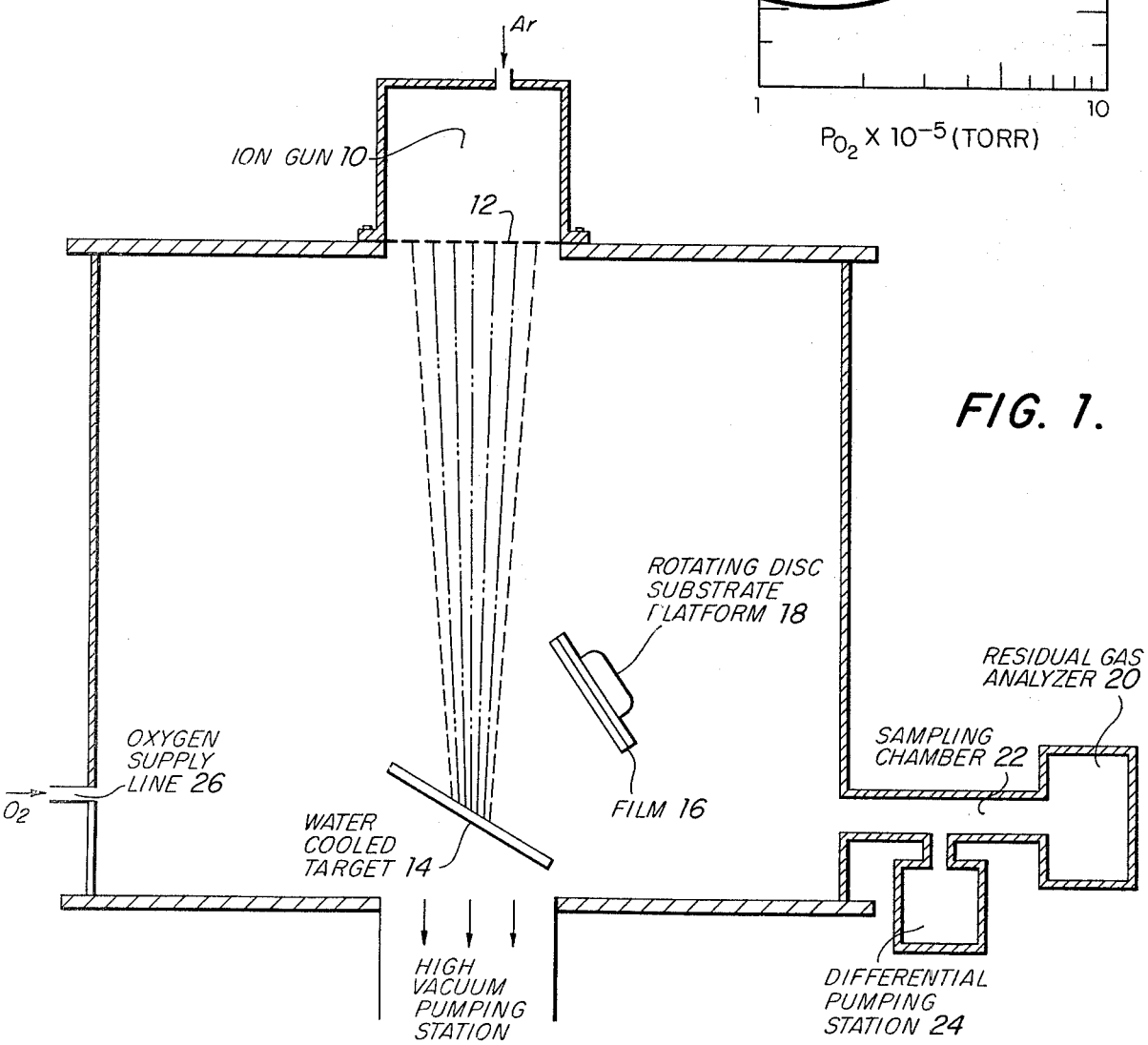
FIG. 1 is a schematic diagram of an ion-beam sputtering apparatus suitable for forming transparent heat mirrors according to this invention.

FIG. 1 is a schematic illustration of the ion-beam sputtering apparatus. An ion-beam gun 10, such as that sold by Commonwealth Scientific Corp., Alexandria, Va., or Ion Tech, Inc., Ft. Collins, Colo., is provided to ionize a gas, such as argon, which is fed into the gun chamber. The argon ions are accelerated by an extractor voltage and directed to the target by grid 12. This stream of argon ions bombards a water-cooled target source 14 of material to be deposited, such as a mixture of indium oxide and tin oxide. Target source 14 is cooled to prevent overheating, and this can be achieved by providing a water jacket at its back side. A polymeric film 16 to be coated is mounted on a rotating disc substrate platform 18.

The partial pressure of oxygen can be monitored in the deposition chamber by a residual gas analyzer 20, such as the one marketed by UTI, Sunnyvale, Calif., under Model No. 100 Nsy. Residual gas analyzer 20 is attached to a sampling chamber 22 with its own pumping station 24 which is connected to the main sputtering chamber through a capillary leak. Oxygen is introduced through an oxygen supply line 26 to maintain the partial pressure of oxygen in the chamber at the desired level.

Figure 2:
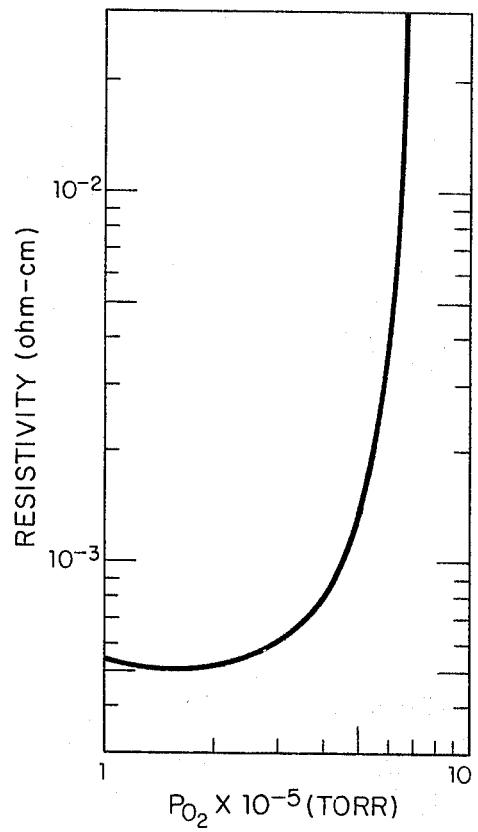
FIG. 2 is a plot of the partial pressure of oxygen versus resistivity of the films formed in an ion-beam sputtering process employing argon ions.

FIG. 2 shows the relationship of resistivity for films deposited on Mylar polyethylene teraphthalate films in an apparatus of FIG. 1. As can be seen, the resistivity is approximately constant for partial pressures of oxygen of up to about $5 \times 10^{-5}$ Torr, but then rapidly rises.

Figure 3:
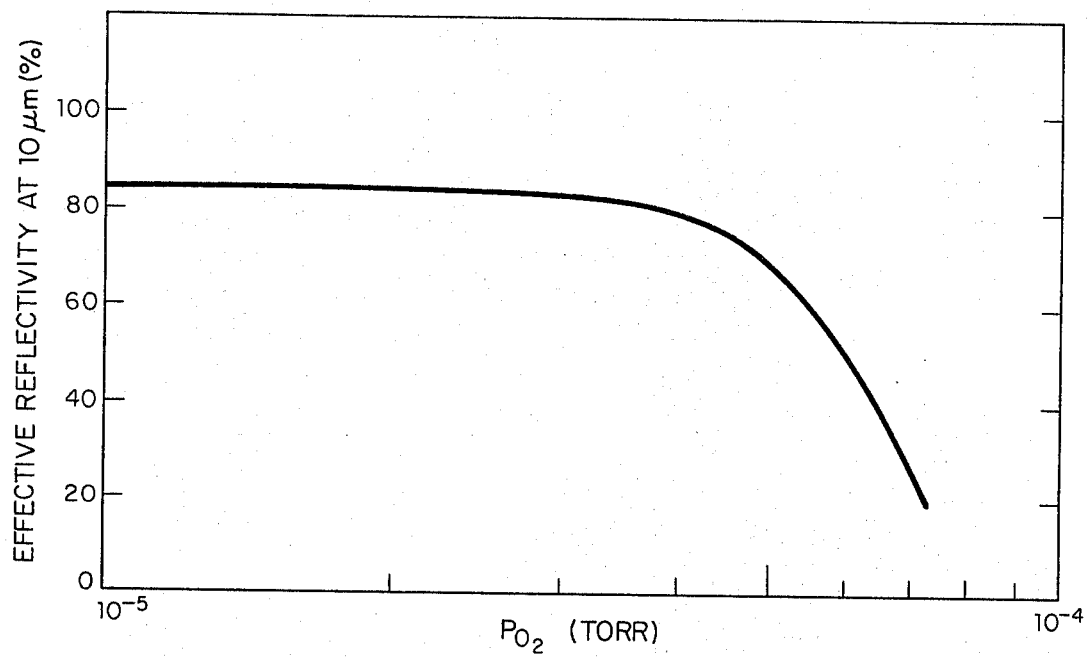
FIG. 3 is a plot of the partial pressure of oxygen versus the effective reflectivity at 10 $\mu$m for films produced in the same ion-beam sputtering process; and, FIG. 4 is a plot of the partial pressure of oxygen versus the integrated transmission of films formed in the same ion-beam sputtering process.

This increase in resistivity usually means that the reflectivity in the infrared (by free electron effects) will go down. FIG. 3 confirms this effect. Therein, it can be seen that the reflectivity at 10 micrometers is about 84% for films (about 0.5 $\mu$m thick) prepared at partial pressures of oxygen of up to about $5 \times 10^{-5}$ Torr, but decreases for higher partial pressures of oxygen. The infrared measurements were made with a Gier Dunkle reflectometer which uses integrating spheres to determine the intergrated reflectivity at near-normal incidence of radiation from a room-temperature blackbody, where emission peaks at 10 microns.

Figure 4:
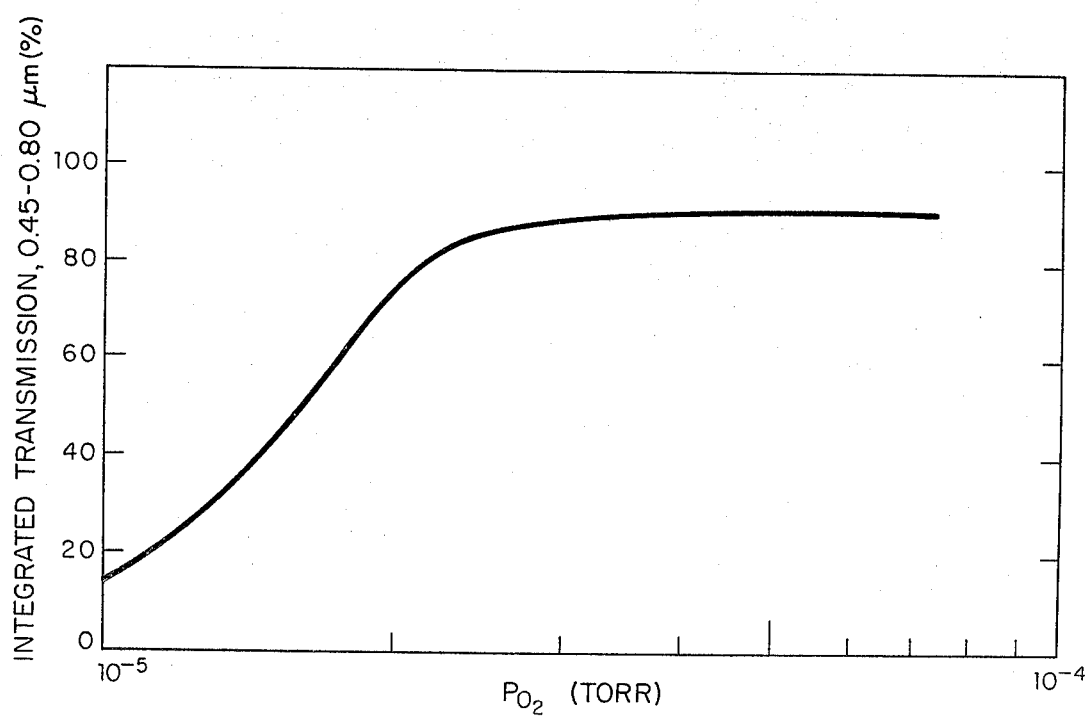

FIG. 4 illustrates the integrated optical transmission of 0.5 $\mu$m thick tin-doped indium oxide films over the range 0.45-0.80 microns wavelength, as a function of partial pressure of oxygen. At low partial pressures, the transparency was quite low and the films appeared dark. With increasing partial pressures, transparency at first increased rapidly exceeding 80% at $3 \times 10^{-5}$ Torr, and then became constant at over 90% for higher partial pressures. Transmissions were plotted with the effects of substrates excluded. Although these measurements were made for 0.5 $\mu$m thick films, the infrared reflectivity of these films at 10 $\mu$m is quite insensitive to film thickness as long as the films are over 0.3 $\mu$m thick. Of course, as the films get thinner, the visible transmission increases.

From these, it can be seen that tin-doped indium oxide films having good transparent heat-reflecting properties can be prepared in an ion-beam sputtering process if the partial pressure is maintained between about $2 \times 10^{-5}$ and about $5 \times 10^{-5}$. The experiments described were done with a deposition rate of about 200 Å/min. Initial experiments at other deposition rates varying from 100 Å/min. to 400 Å/min. indicate that the effective range of partial pressure of oxygen shifts slightly with the rate of deposition. For example, at a deposition rate of 100 Å/min., the effective range of oxygen partial pressure was from about $1.0 \times 10^{-5}$ to $4 \times 10^{-5}$ Torr; at a deposition rate of 400 Å/min., the effective range was $3 \times 10^{-5}$ to $6 \times 10^{-5}$ Torr.

In general, the oxygen window for good quality films is very narrow and slightly sensitive to deposition conditions. At deposition rates of about 200 Å/min., this window is from about $2 \times 10^{-5}$ to about $5 \times 10^{-5}$ Torr. At lower deposition rates, the oxygen window is shifted slightly to lower partial pressures of oxygen whereas at higher rates, it is shifted slightly higher.

Although an ion-beam sputtering process has been specifically described, any deposition process is suitable if it does not elevate the substrate temperatures above those tolerable by the polymeric substrates.

Good quality transparent heat-reflecting films having comparable properties to those prepared by ion-beam sputtering have been deposited by thermal evaporation of tin-doped indium oxide from tantalum and platinum boats containing mixtures of indium oxide and tin oxide. In this case, partial oxygen pressure was maintained at about $4-5 \times 10^{-5}$ Torr at a deposition rate of 200 Å/min. The oxygen was fed into a vacuum system through nozzle jets directed at the space directly above the evaporation boat for optimal control of film quality. No post deposition annealing was required.

Other low temperature processes include magnetron sputtering, triode sputtering, and certain vacuum deposition processes that do not cause excessive heating of the substrate or electron bombardment.

The choice of specific polymer substrates will, of course, depend upon the exact application. Some examples of films include Mylar polyethylene teraphthalate, Lexan polycarbonate, Kapton polyimide and FEP Teflon.

Although the experimental work described above was done with tin-doped indium oxide, antimony-doped tin oxide films can also be deposited at low temperatures on polymeric substrates by the techniques described. These are preferred materials. In addition, however, any doping species which provides free charge carriers can be employed. For example, in the $In_2O_3$ case, the dopants can be Sn, Ge, Si or Sb. Doping can also be achieved by oxygen deficiencies. In the $SnO_2$ case, examples of suitable dopants include Sb or Bi.

Those skilled in the art will recognize many equivalents to the specific embodiments of the invention described herein. Such equivalents are considered part of this invention and are intended to be encompassed by the scope of the following claims.

What is claimed is:

1. In the method of fabricating transparent heat-mirrors including deposition of films of a material selected from doped indium oxide or doped tin oxide on polymer substrates by sputtering, thermal evaporation, vacuum deposition or electron bombardment, the improvement of maintaining a partial pressure of oxygen during deposition within a range which produces films of said material which are transparent to the visible solar spectrum and reflecting to the infrared spectrum without necessary post-deposition treatment.

2. The improvement of claim 1 wherein said material comprises tin-doped indium oxide or antimony-doped tin oxide.

3. The improvement of claim 2 wherein said range of partial pressure of oxygen during deposition is within the range from about $1 \times 10^{-5}$ to about $6 \times 10^{-5}$ Torr.

4. In a process for depositing tin-doped indium oxide or antimony-doped tin oxide films into polymeric substrates to produce transparent heat-mirrors by sputtering, thermal evaporation, vacuum deposition or electron bombardment:

the improvement of controlling the partial pressure of oxygen during said deposition process to between about $1 \times 10^{-5}$ Torr and about $6 \times 10^{-5}$ Torr.

5. An ion-beam sputtering process for producing transparent heat-mirrors, comprising:

a. providing a target source of indium oxide and tin in an ion-beam sputtering chamber;

b. mounting a polymeric substrate at a location within said ion-beam sputtering chamber where deposition of tin-doped indium oxide occurs;

c. bombarding said target source with ions sufficient to cause ejection of indium oxide and tin atoms from said target source; and d. controlling the partial pressure of oxygen within said sputtering chamber during deposition to a level of between about $1 \times 10^{-5}$ Torr and about $6 \times 10^{-5}$ Torr.

6. A method of claim 4 wherein the bombarding ions comprise argon ions.

7. A method of claim 6 wherein said target source comprises a mixture of indium oxide and tin oxide or tin.

8. A method of claim 7 wherein said polymeric substrate comprises a polymeric film.

9. A method of claim 8 wherein said polymeric film comprises a film of polyethylene terephthalate.

10. In a process for depositing tin-doped indium oxide or antimony-doped tin oxide onto polymeric substrates by sputtering, thermal evaporation, vacuum deposition or electron bombardment:
the improvement of controlling the partial pressure of oxygen during said deposition process to a value of below about $5 \times 10^{-5}$ Torr.

* * * * *